United States Patent [19]

Tadokoro

[11] Patent Number: 4,559,718
[45] Date of Patent: Dec. 24, 1985

[54] METHOD AND APPARATUS FOR DRYING SEMICONDUCTOR WAFERS

[75] Inventor: Hideo Tadokoro, Tokyo, Japan

[73] Assignee: Oki Electric Industry Co., Ltd., Tokyo, Japan

[21] Appl. No.: 633,134

[22] Filed: Jul. 23, 1984

[30] Foreign Application Priority Data

Aug. 2, 1983 [JP] Japan .................. 58-140466
Aug. 2, 1983 [JP] Japan .................. 58-140467
Aug. 2, 1983 [JP] Japan .................. 58-140468

[51] Int. Cl.$^4$ ............................................. F26B 5/08
[52] U.S. Cl. ............................................. 34/8; 34/58; 118/52; 414/744 B
[58] Field of Search .............. 427/240; 118/52, 54, 118/50; 414/744 B; 901/40; 198/379; 34/8, 58, 68

[56] References Cited

U.S. PATENT DOCUMENTS 3,730,134 5/1973 Kadi ........................... 118/52
4,280,689 7/1981 Frosch et al. ................. 118/52
4,313,266 2/1982 Tam ........................... 34/8

FOREIGN PATENT DOCUMENTS 57-15416 1/1982 Japan .

Primary Examiner—Larry I. Schwartz
Attorney, Agent, or Firm—Frishauf, Holtz, Goodman & Woodward

[57] ABSTRACT

A semiconductor wafer is held on a first rotating element in a manner having a first portion of one surface of the wafer stuck on the first rotating element. The first rotating element is rotated together with the wafer thus held thereon to remove moisture from surface portions of the wafer other than the first portion. Then, the wafer is held on a second rotating element in a manner having a second portion of the one surface of the wafer stuck on the second rotating element. The second rotating element is rotated together with the wafer thus held thereon to remove moisture from the surfaces of the wafer including at least the first portion thereof, thereby completely drying the wafer.

21 Claims, 17 Drawing Figures

FIG. 11A
(a)
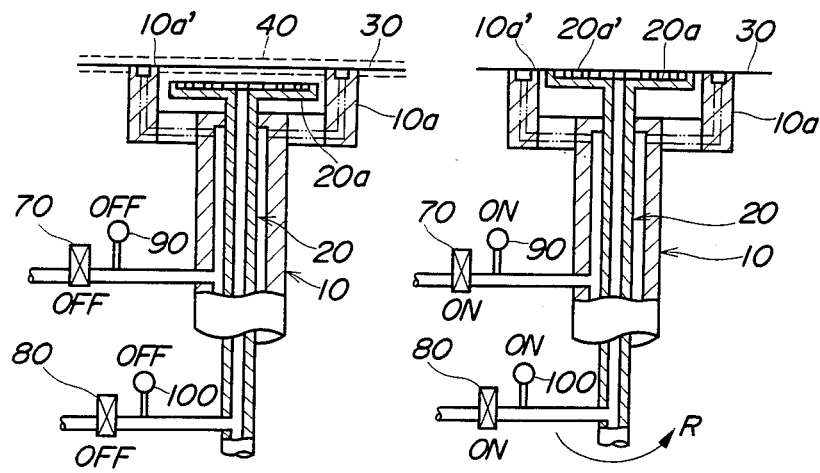
(b)
(c)
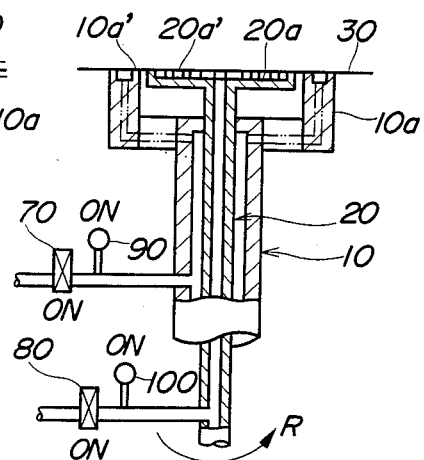
(d)
FIG. 11
| FIG.11A | FIG.11B |

METHOD AND APPARATUS FOR DRYING SEMICONDUCTOR WAFERS

BACKGROUND OF THE INVENTION

This invention relates to a method and apparatus for drying a semiconductor wafer, which can dry the wafer in a manner keeping the wafer clean.

A conventional apparatus for drying semiconductor wafers is adapted to dry a plurality of such wafers in a batch at one time, as disclosed e.g. by Japanese Patent Application No. 89212/1980 published under Japanese Provisional Patent Publication No. 57-15416. That is, it comprises a rotor, and carriers mounted in the rotor and accommodating a plurality of semiconductor wafers in a manner spaced from one another. As the carriers rotate together with the rotating rotor, water droplets on the surfaces of the wafers in the carriers are dissipated or scattered due to centrifugal force produced by the rotation of the carriers to thereby dry the wafers.

However, such conventional drying apparatus has drawbacks. For instance, portions of the wafers in contact with the carriers cannot be promptly dried. Furthermore, since the surfaces of wet wafers in air are easily charged with static electricity which attracts dust or dirt, water droplets scattered by centrifugal force from some wafers which still contain such foreign matters contaminate clean surfaces of the other wafers during the drying process.

SUMMARY OF THE INVENTION

It is an object of the invention to provide a method and apparatus for drying semiconductor wafers, which is capable of drying the wafers in a perfect manner while keeping them clean, thereby enhancing the quality of the dried wafers.

It is a further object of the invention to provide a method and apparatus for drying semiconductor wafers, which is adapted to perform the drying operation in a simple and prompt manner, thereby achieving the drying operation with high efficiency.

The present invention provides a method for drying a semiconductor wafer, which comprises the following steps:

(a) holding the wafer on a first rotating element in such a manner that a first portion of one of surfaces of the wafer is stuck on the first rotating element;

(b) rotating the first rotating element together with the wafer held thereon to produce centrifugal force enough to cause dissipation of moisture on portions of the surfaces of the wafer other than the above first portion thereof to thereby remove the moisture from the other portions;

(c) holding the wafer on a second rotating element in such a manner that a second portion of the one surface of the wafer other than the first portion thereof is stuck on the second rotating element; and (d) rotating the second rotating element together with the wafer held thereon to produce centrifugal force enough to cause dissipation of residual moisture on the surfaces of the wafer including at least the above first portion thereof to thereby remove the residual moisture from the wafer.

According to one embodiment of the method of the invention, the wafer is transferred from the first rotating element to the second rotating element, by interrupting the rotation of the first rotating element after execution of the above step (b), and releasing the first rotating element from the one surface of the wafer, followed by executing the above step (c). According to a second embodiment of the invention, the transfer of the wafer from the first rotating element to the second rotating element is performed by rotating the second rotating element at a speed equal to that of the first rotating element and holding the wafer on the second rotating element. Thus rotating in such a manner that the second portion of the one surface of the wafer other than the first portion thereof is stuck on the second rotating element, while the step (b) is being executed.

Further, the invention provides an apparatus for drying a semiconductor wafer, which comprises:

a first rotating element rotatable about its own axis;

first holding means for holding the wafer on the first rotating element for rotation therewith in such a manner that a first portion of one of surfaces of the wafer is stuck on the first rotating element;

a second rotating element rotatable about its own axis;

second holding means for holding the wafer on the second rotating element for rotation therewith in such a manner that a second portion of the one surface of the wafer other than the above first portion thereof is stuck on the second rotating element;

transfer means for transferring the wafer from one of the first and second rotating elements to the other; and driving means for causing rotation of the first and second rotating elements. The driving means is adapted to cause each one of the first and second elements to rotate at such a high speed as to produce centrifugal force enough to cause dissipation of moisture on the surfaces of the wafer held on the each one of the first and second rotating elements.

The above and other objects, features and advantages of the invention will be more apparent from the ensuing detailed description taken in conjunction with the accompanying drawings.

DETAILED DESCRIPTION

Figure 1:
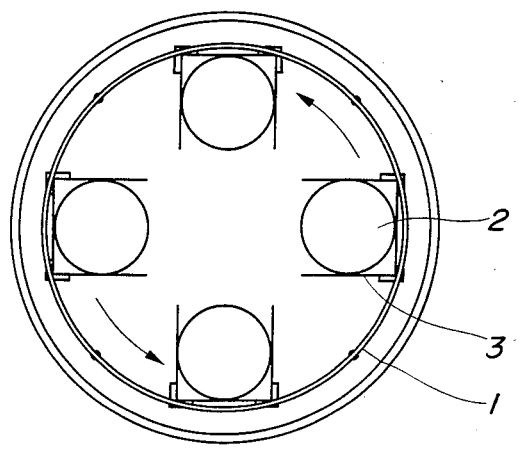
FIG. 1 is a schematic top plan view of a conventional semiconductor wafer drying apparatus.
Figure 2:
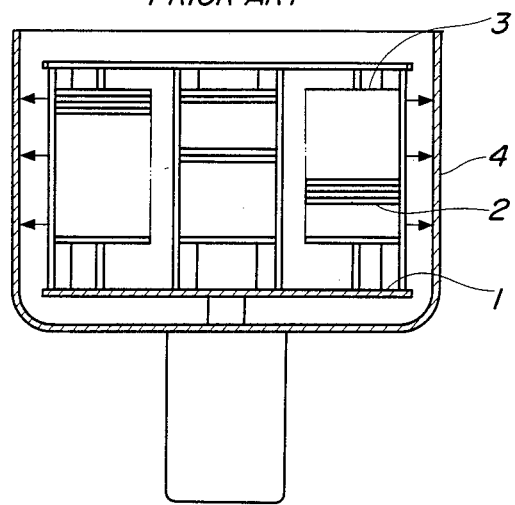
FIG. 2 is a schematic vertical longitudinal sectional view of the apparatus of FIG. 1.

Referring first to FIGS. 1 and 2, there is illustrated a conventional semiconductor wafer drying apparatus, by way of example. The apparatus comprises a rotor 1, and a plurality of, e.g. four, carriers 3 mounted in the rotor 1 and circumferentially arranged along the periphery of the rotor 1. The carriers 3 each accommodate a plurality of semiconductor wafers 2 spaced from one another. As the rotor 1 rotates at a high speed, the carriers 3 rotate in unison with the rotating rotor, whereby water droplets on the surfaces of the semiconductor wafers 2 are scattered due to centrifugal force, thus drying the wafers.

However, the conventional arrangement, which dries a stack of semiconductor wafers within the carriers at one time as noted above, has various drawbacks as previously stated.

Next, the semiconductor wafer drying method and apparatus according to the present invention will be described with reference to the drawings.

Figure 3:
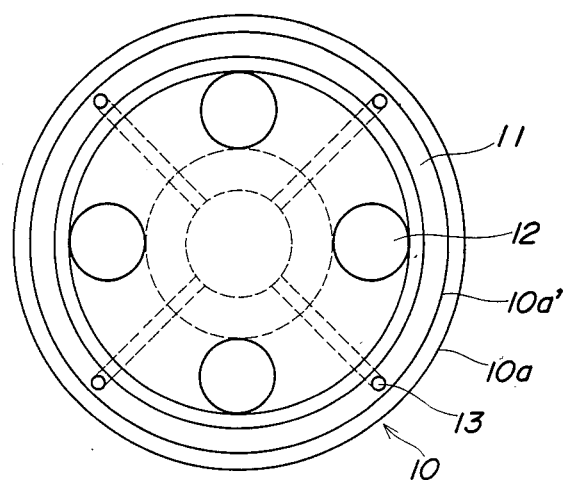
FIG. 3 is a top plan view of a first vacuum nozzle applied to a first embodiment of the semiconductor drying method according to the invention.
Figure 4:
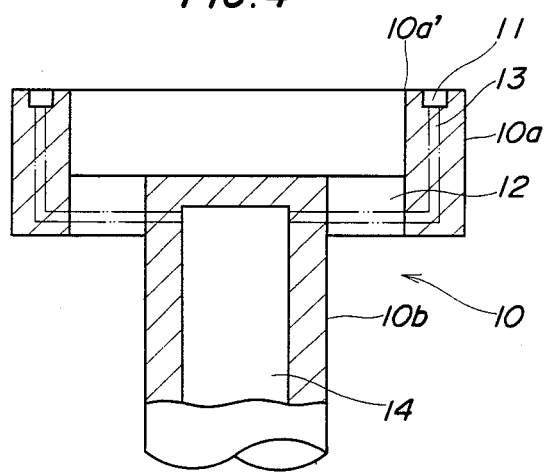
FIG. 4 is a vertical longitudinal sectional view of the first vacuum nozzle of FIG. 3.
Figure 5:
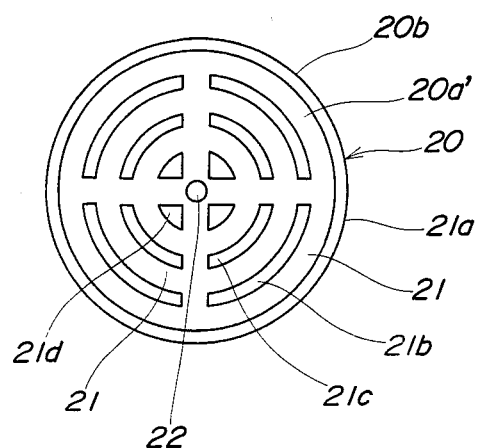
FIG. 5 is a top plan view of a second vacuum nozzle applied to the first embodiment of the method according to the invention.
Figure 6:
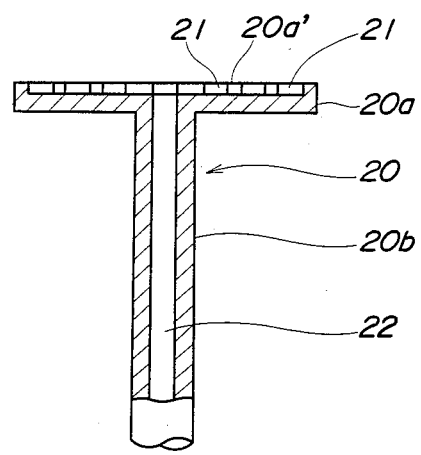
FIG. 6 is a vertical longitudinal sectional view of the second vacuum nozzle of FIG. 5.

FIGS. 3 through 8 show a first embodiment of the method of the invention, wherein FIGS. 3 and 4 illustrate a first vacuum nozzle of an apparatus for carrying out the method of the invention, and FIGS. 5 and 6 a second vacuum nozzle of the same apparatus, respectively. In FIGS. 3 and 4, the first vacuum nozzle 10 comprises a peripheral chuck 10a in the form of a hollow cylinder, and a shaft portion 10b formed integrally with the peripheral chuck 10a and axially extending therefrom. The peripheral chuck 10a has an open end face 10a' remote from the shaft portion 10b and formed therein with an annular groove 11 for causing a semiconductor wafer, not shown, to be stuck by vacuum suction to the open end face 10a'. An end wall of the peripheral chuck 10a facing the shaft portion 10b is formed therein with four through holes 12 arranged at circumferentially equal intervals. The peripheral chuck 10a is also formed therein with four vacuum passages 13 opening at ends in the bottom surface of the annular groove 11 at circumferential equal intervals. The vacuum passages 13 extend through the peripheral wall and end wall of the peripheral chuck 10a and communicate with another vacuum passage 14 axially formed within the shaft portion 10b. On the other hand, the second vacuum nozzle appearing in FIGS. 5 and 6 comprises a radially extending central chuck 20a in the form of a disk, and an axially extending shaft portion 20b formed integrally with the central chuck 20a. The central chuck 20a has an end face 20a' remote from the shaft portion 20b and formed therein with a plurality of annular grooves 21 defined by integral ribs 21a–21d formed on the end face 20a' and arranged concentrically with each other, for causing a semiconductor wafer, not shown, to be stuck by vacuum suction to the end face 20a'. These annular grooves 21 communicate with each other and also with a central open end of a vacuum passage 22 axially formed in the shaft portion 20b, the central open end opening in the end face 20a' of the central chuck 20a. Thus, the end face 20a' of the central chuck 20a acts as a holding surface for holding a semiconductor wafer stuck thereon. The end face 20a' of the central chuck 20a has a smaller diameter than the inside diameter of the open end 10a' of the peripheral chuck 10a of the first vacuum nozzle 10 so that a portion of a semiconductor wafer stuck to the central chuck 20a does not overlap with a portion of the same wafer stuck to the peripheral chuck 10a and is wholly located radially inwardly of the latter.

Figure 7:
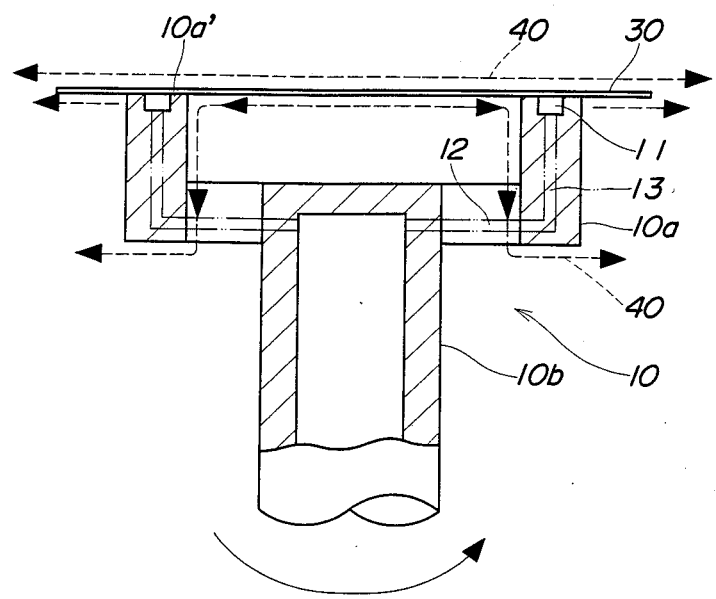
FIG. 7 is a vertical longitudinal sectional view of the first vacuum nozzle with a semiconductor wafer stuck thereon as applied to the first embodiment of the method of the invention.
Figure 8:
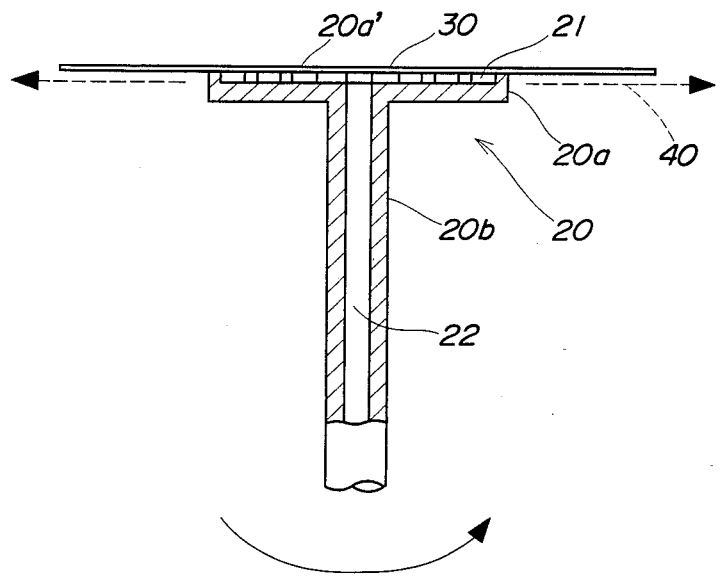
FIG. 8 is a vertical longitudinal sectional view of the second vacuum nozzle with the semiconductor wafer stuck thereon as applied to the first embodiment of the method of the invention.

Next, the manner of drying a semiconductor wafer by the use of the first and second vacuum nozzles constructed as above will now be described with reference to FIGS. 7 and 8. As shown in FIG. 7, in a first step (a first dissipation-removal step), a semiconductor wafer 30, which is wet, is placed onto the open end face 10a' of the peripheral chuck 10a of the first vacuum nozzle 10 remote from the shaft portion 10b, with the center of the wafer aligned with the axis of rotation of the first vacuum nozzle 10. On this occasion, a backside surface of the wafer 30 formed with no semiconductor element should advantageously be put into contact with the open end face 10a' of the first vacuum nozzle 10, so as to avoid damage to the semiconductor elements which would otherwise be caused by the contact with the end face 10a'.

Then, a vacuum generating means, not shown, connected to the vacuum passage 14 in the shaft portion 10b is actuated to supply vacuum to the annular groove 11 through the vacuum passages 14, 13 to thereby cause the semiconductor wafer 30 to be stuck by vacuum suction to the open end face 10a'. Following this, a rotating means, not shown, connected to the shaft portion 10b is actuated to cause rotation of the first vacuum nozzle 10 about its own axis at a high speed so such that the resulting centrifugal force causes water droplets 40 on the wafer 30 to be dissipated or scattered in the radially outward directions as shown by the arrows in FIG. 7. Thus, surface portions of the wafer 30 other than the surface portion stuck to the vacuum nozzle 10 are dried.

After the above surface portions of the wafer 30 have thus been dried, the rotation of the first vacuum nozzle 10 is interrupted, and the operation of the vacuum generating means is stopped to relieve the wafer 30 of its vacuum suction to the holding surface 10a', followed by removing the wafer 30 from the first vacuum nozzle 10. Thereafter, a second step (a second dissipation-removal step) is executed. As shown in FIG. 8, the wafer 30 is placed onto the holding surface 20a' of the second vacuum nozzle 20 with its center aligned with the axis of rotation of the vacuum nozzle 20. Also on this occasion, the backside surface of the wafer should preferably be placed in contact with the second vacuum nozzle 20 to avoid damage to the semiconductor element-formed side surface.

Next, a vacuum generating means, not shown, connected to the vacuum passage 22 formed in the shaft portion 20b of the first vacuum nozzle 20 is actuated to cause the wafer 30 to be stuck by vacuum suction to the second vacuum nozzle 20, and then in the same manner as stated above a rotating means, not shown, connected to the shaft portion 20b is actuated to cause rotation of the second vacuum nozzle 20 at a high speed, whereby residual water droplets 40 on the surface portion of the wafer 30 previously stuck to the first vacuum nozzle 10 and now exposed to the atmosphere are scattered in the radially outward directions due to the resulting centrifugal force. By successively executing the above first and second steps, moisture can be completely removed from the semiconductor wafer 30. That is, since in the second step a portion of the backside surface of the wafer 30 not overlapping with or other than the portion previously stuck to the first vacuum nozzle 10 is stuck to the second vacuum nozzle 20, moisture deposited over the whole surfaces of the wafer 30, particularly residual moisture between surface portions of the backside surface of the wafer and the first vacuum nozzle 10, which has not been removed in the first step, can be completely removed in the second step.

Moreover, according to the illustrated embodiment, as described above, in the first step the wafer 30 is engaged with the open end face 10a' of the peripheral chuck 10a of the first vacuum nozzle 10 at a peripheral annular portion radially outward of a central portion of the wafer to be engaged with the second vacuum nozzle 20 in the second step. Therefore, moisture removal first takes place at the central portion of the wafer in the first step, followed by moisture removal at the peripheral annular portion of the wafer in the second step, thus drying the wafer over its entire surfaces.

Further, as distinct from the aforestated conventional apparatus in which a batch of wafers are subjected to drying at one time, it can be avoided that clean wafers are stained by other dirty wafers during the drying operation, and also unnecessary drying of the carriers is omitted, thereby reducing the amount of dust to be produced during drying, as well as the amount of static electricity which causes adherence of dust to the wafers.

Besides, as stated above, according to the invention wafers are dried piece by piece, which makes it possible to maintain a clean drying atmospheric condition with ease, enhancing the quality of dried wafers.

Figure 9:
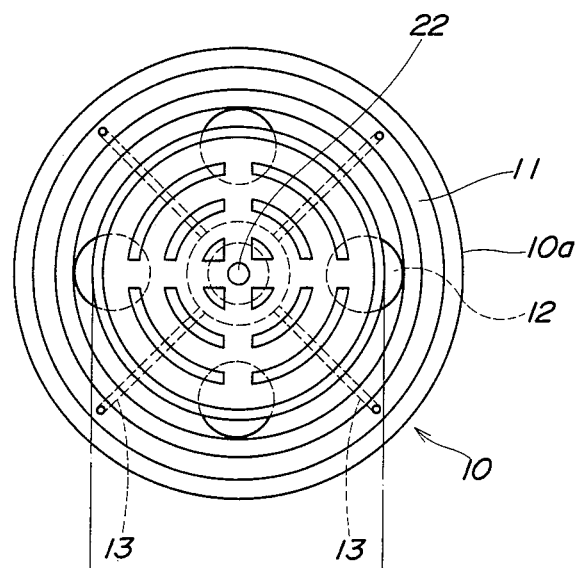
FIG. 9 is a top plan view of a vacuum nozzle assembly applied to a second embodiment of the method of the invention.
Figure 10:
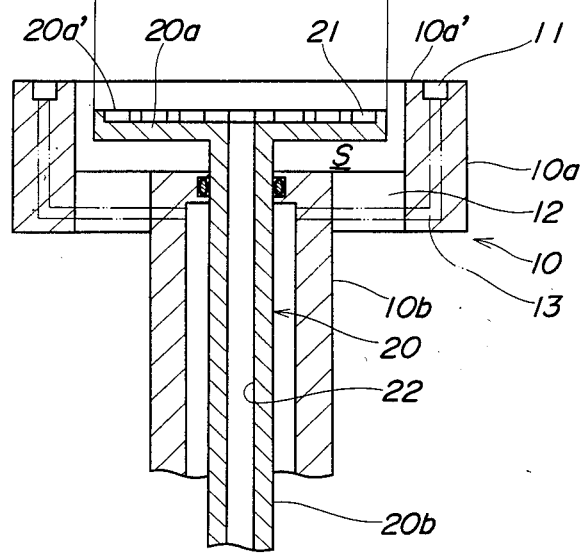
FIG. 10 is a vertical longitudinal sectional view of the vacuum nozzle assembly of FIG. 9.
Figure 11B:
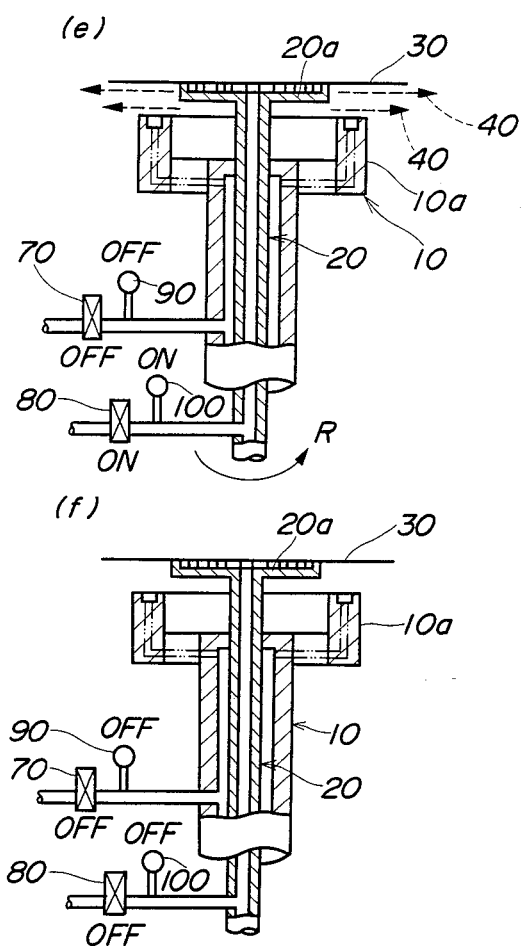
FIGS. 11 (a)–(f) are schematic vertical longitudinal sectional views of the vacuum nozzle assembly in different positions for performing the steps of the second embodiment of the method of the invention.

FIGS. 9 through 11 show a second embodiment of the method according to the invention. In this second embodiment are used first and second vacuum nozzles substantially identical in construction with those employed in the first embodiment described above. Therefore, in FIGS. 9 through 11 elements and parts corresponding to those in FIGS. 3 through 8 are designated by identical reference characters, and detailed description of which is omitted. According to the second embodiment, the second vacuum nozzle 20 is disposed such that its shaft portion 20b extends through the hollow shaft portion 10b and bottom end wall of the peripheral chuck 10a of the first vacuum nozzle 10 along their axes in the axial and vertical direction and in a manner allowing axial movement of the first and second vacuum nozzles 10, 20 relative to each other, and the central chuck 20a is located within an internal space S defined within the peripheral chuck 10a of the first vacuum nozzle 10 and vertically displaceable together with the shaft portion 10b relative to the peripheral chuck 10a. Further, as in the first embodiment, also the holding surface 20a' of the second vacuum nozzle 20 has its outer diameter set smaller than the inside diameter of the annular holding surface 10a' of the first vacuum nozzle 10 so as to avoid overlapping of the two surfaces 10a', 20a', that is, so as to hold a central portion of a semiconductor wafer other than a peripheral portion thereof held by the first vacuum nozzle.

In this embodiment, the first vacuum nozzle 10 and the second vacuum nozzle 20 are connected to respective different vacuum supply means and selectively actuated by means of respective solenoid valves 70 and 80 appearing in FIGS. 11 (a)–(f). These vacuum supply means have pressure-responsive switches 90 and 100 for detecting completion of the action of holding a semiconductor wafer 30 stuck on the respective vacuum nozzles 10, 20, as appearing in FIGS. 11 (a)–(f).

Further, a synchronous rotating means, not shown, is provided for rotating the first and second vacuum nozzles 10, 20 in synchronism at the same speed.

The manner of drying a semiconductor wafer according to this embodiment will now be described. First, as shown in FIG. 11 (a), a wet semiconductor wafer 30 is placed onto the holding surface 10a' of the peripheral chuck 10a of the first vacuum nozzle 10, preferably at the backside surface opposite to the semiconductor element-formed side surface, with its center aligned with the axis of rotation of the first vacuum nozzle 10 (a first step).

Next, in a second step shown in FIG. 11 (b), the solenoid valve 70 is energized (ON) to supply vacuum to the holding surface 10a' to effect adherence of the wafer 30 to the same holding surface. When the adherence is completed, the pressure-responsive switch 90 is turned on (ON) to actuate the aforementioned synchronous rotating means to rotate the first and second vacuum nozzles in the direction indicated by the arrow R.

When the rotational speed of the vacuum nozzles 10, 20 reaches a predetermined value, the resulting centrifugal force causes water droplets 40 on surface portions of the wafer 30 other than a surface portion stuck to the holding surface 10a' to be scattered away from the wafer.

Next in a step shown in FIG. 11 (c), the first vacuum nozzle 10 is lowered while continuing its rotation. When the holding surface 10a' comes into the same level with the holding surface 20a' of the second vacuum nozzle 20 which is rotating at the same speed as the first vacuum nozzle 10, the solenoid valve 80 is energized (ON) to allow vacuum to be supplied to the holding surface 20a' so that the wafer 30 becomes stuck to the same surface.

In a step shown in FIG. 11 (d), the pressure-responsive switch 100 is turned on (ON) when the above action of holding the wafer 30 on the holding surface 20a' is completed, and responsive to this turning-on of the switch 100 the solenoid valve 70 is deenergized (OFF) to release the wafer 30 from its adherence to the holding surface 10a', making the former detachable from the latter.

In a step shown in FIG. 11 (e), the holding surface 10a' of the first vacuum nozzle 10 is lowered to a level lower than the holding surface 20a' of the second vacuum nozzle 20, whereby the wafer 30 is supportedly held on the holding surface 20a' alone. Residual water droplets 40 on the surface portion of the wafer 30 previously stuck to the first vacuum nozzle 10 are dissipated by centrifugal force caused by continued rotation of the wafer 30 together with the second vacuum nozzle 20.

In a step in FIG. 11 (f), the wafer 30 has been dried over its entire surfaces, and therefore the rotation of the first and second vacuum nozzles 10, 20 is stopped. Then, the solenoid valve 80 of the second vacuum nozzle 20 is deenergized (OFF) to allow detachment of the wafer 30 from the holding surface 20a'.

As stated above, according to the second embodiment of the method of the invention, in addition to the same results as those obtained by the first embodiment previously described, the transfer of the wafer 30 from the first vacuum nozzle 10 to the second vacuum nozzle 20 is effected without stopping the rotation of the nozzles. This can save the operating time by the time required for rotational a nozzle to recover a required speed from the time the nozzle resumes rotating after completion of the transfer of the wafer thereto, thereby enhancing the efficiency of operation.

FIGS. 12 through 15 illustrate a semiconductor drying apparatus according to an embodiment of the invention. The apparatus according to the illustrated embodiment is adapted to carry out both of the first and second embodiments of the method of the invention described hereinbefore. In FIGS. 12 through 15, elements and parts corresponding to those in FIGS. 1 through 11 are designated by identical reference characters, and detailed description of which is omitted.

Figure 12:
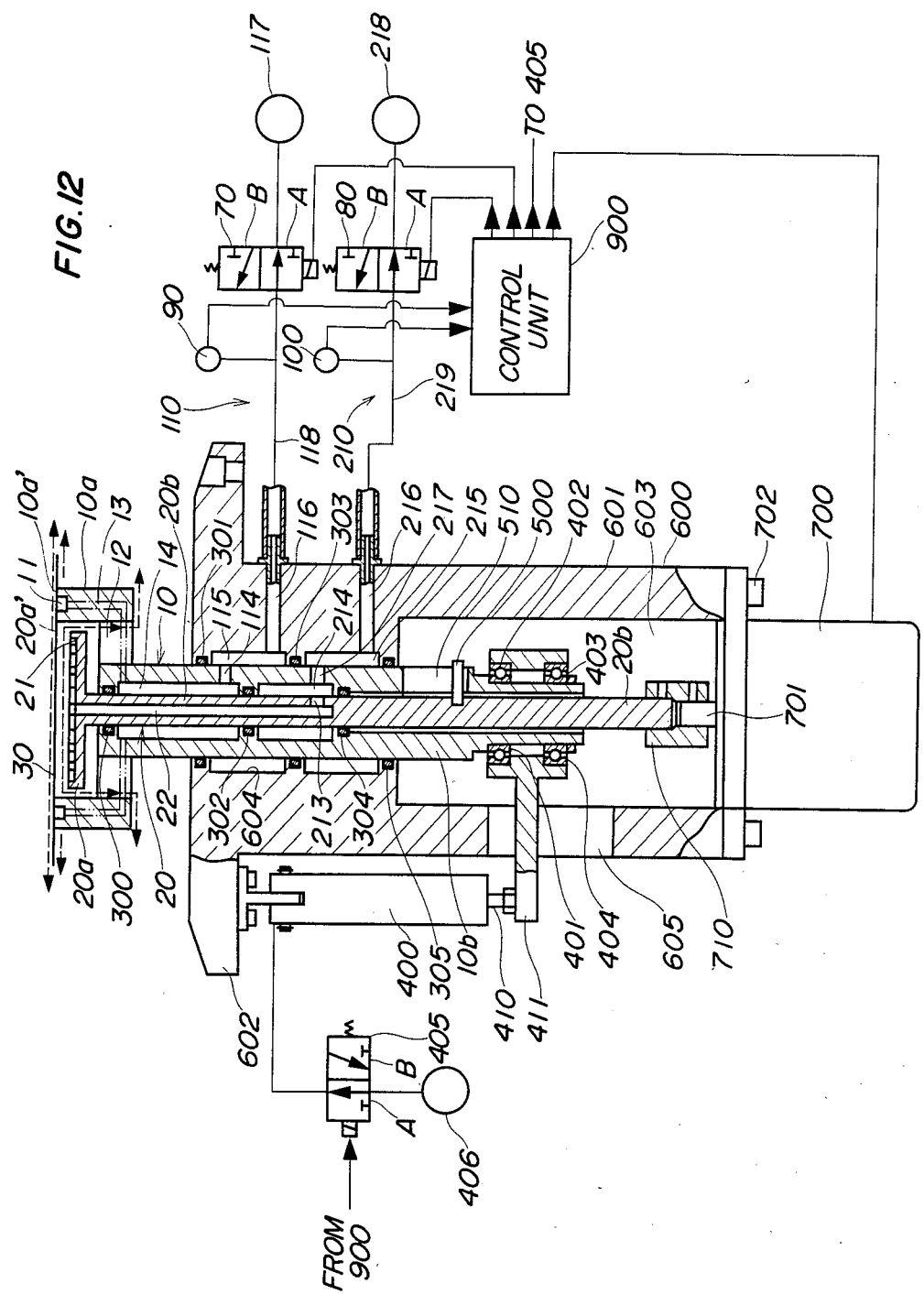
FIG. 12 is a vertical longitudinal sectional view of an embodiment of the semiconductor wafer drying apparatus according to the invention.

Referring first to FIG. 12, there is illustrated the whole construction of the apparatus. In the same manner as illustrated in FIGS. 9 and 10, the second vacuum nozzle 20 is fitted through the first vacuum nozzle 10, wherein the shaft portion 10b of the first vacuum nozzle 10 is supportedly fitted through a through hole 604 axially formed in a cylindrical body 601 of a housing 600 and vertically or axially movable relative to the housing 600. The annular groove 11 of the first vacuum nozzle 10 communicates with a first vacuum supply means 110 by way of the passages 13, 14 formed in the first vacuum nozzle 10, a radial hole 114 formed in the shaft portion 10b, an annular space 115 defined between the shaft portion 10b and the through hole 604, and a channel 116 formed in the body 601 of the housing 600. On the other hand, the concentric annular grooves 21 of the second vacuum nozzle 20 communicate with a second vacuum supply means 210 by way of the axial hole 22 formed in the shaft portion 20b, a radial hole 213 formed in the shaft portion 20b, an annular space 214 defined between the shaft portion 20b and the shaft portion 10b of the first vacuum nozzle 10, a radial hole 217 formed in the shaft portion 10b, an annular groove 215 defined between the shaft portion 10b and the through hole 604 formed in the body 601, and a channel 216 formed in the body 601. O-rings 300, 302, and 304 are interposed between the shaft portions 10b, 20b, while O-rings 301, 303 and 305 are interposed between the shaft portion 10b and the through hole 604 in the housing 600. These O-rings isolate the passageway leading to the first vacuum supply means 110 and the passageway leading to the second vacuum supply means 210 from each other in an airtight manner such that even during rotation of the first and second vacuum nozzles 10, 20, vacuum can be transmitted to the grooves 11, 21 in the wafer holding surfaces 10a', 20a' from the first and second vacuum supply means 110, 210 independently of each other.

Of the above-mentioned passages, the axial passages 115, 214, and 215 have large axial sizes enough to always maintain communication with the respective radial passages 114, 213, and 217 when the first vacuum nozzle 10 is vertically moved through its whole stroke.

An air cylinder 400 is supportedly suspended from a flange 602 formed integrally with the housing 600, of which a piston rod 410 connected to a piston, not shown, received within the cylinder is coupled at an end to one end of a coupling member 411 which in turn has its other end fitted on a lower end of the shaft portion 10b of the first vacuum nozzle 10 and extends through an opening 605 formed in the cylindrical body 601 of the housing 600. Radial bearings 401–404 are interposed between the coupling member 411 and the shaft portion 10b to permit rotation of the first vacuum nozzle 10 relative to the coupling member 411. Thus, as the piston rod 410 of the air cylinder 400 expands or contracts with respect to the cylinder, the first vacuum nozzle 10 is vertically moved to and fro while it is allowed to rotate about its own axis.

The air cylinder 400 is connected to a pressure source 406 by way of a solenoid valve 405. The solenoid valve 405 is disposed to operate in response to a control signal from a control unit 900, hereinafter referred to, in such a manner that when the valve assumes a position A in FIG. 12, pressurized air is supplied from the pressure source 406 to the air cylinder 400, while when the valve assumes a position B, the pressurized air is discharged from the air cylinder 400 into the atmosphere.

Figure 13:
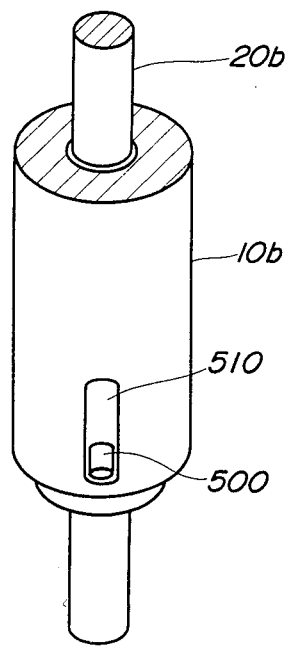
FIG. 13 is an enlarged perspective view of a coupling mechanism employed in the apparatus of FIG. 12.

The first and second vacuum nozzles 10, 20 are forced to rotate concurrently at the same speed while they are prohibited from making relative circumferential displacement by means of a coupling means. The coupling means in the present embodiment is constructed as best shown in FIG. 13, and comprises an axial elongate hole 510 formed in the peripheral wall of the shaft portion 10b of the first vacuum nozzle 10, and a pin 500 radially planted on the peripheral wall of the shaft portion 20b of the second vacuum nozzle 20 and engaged in the elongate hole 510. Rotation of the shaft portion 20b of the second vacuum nozzle 20 is transmitted to the first vacuum nozzle 10 as the pin 500 urges a longer side wall of the hole 510, i.e. the shaft portion 10b in the circumferential direction during rotation of the second vacuum nozzle 20. Further, the elongate hole 510 has a large axial size enough to permit vertical displacement of the first vacuum nozzle 10 relative to the second vacuum nozzle 20 through a required stroke length.

The aforementioned coupling member 411, the bearings 401–404, and the coupling means 500, 510 are disposed within a hollow cavity 603 defined within a lower half portion of the cylindrical body 601 of the housing 600.

An output shaft 701 of a motor 700 is coupled to a lower end of the shaft portion 20b of the second vacuum nozzle 20 by means of a coupling means 710. The main body of the motor 700 is fixed to a lower end of the cylindrical body 601 of the housing 600 by means of fastening bolts 702, etc. The motor 700 is electrically connected to the control unit 900 to be driven by a driving signal therefrom.

The first and second vacuum supply means 110, 210 each comprise a vacuum source 117, 218, a vacuum conduit 118, 219 extending between the vacuum source and the channel 116, 216, the solenoid valve 70, 80 arranged across the vacuum conduit 118, 219, and a sensor 90, 100, formed e.g. of a pressure gauge, for detecting the completion of adherence of the wafer 30 to the holding surface 10a', 20a' of the first or second vacuum nozzle 10, 20. The solenoid valves 70, 80 and the sensors 90, 100 are electrically connected to the control unit 900 which in turn is adapted to control the solenoid valves 70, 80 to change in position in response to output signals from the sensors 90, 100 and in a predetermined manner. The solenoid valves 70, 80 are each adapted to connect the vacuum source 117, 218 to the channel 116, 216 via the conduit 118, 219 when it is energized to assume a first position A in FIG. 12, and cause the conduit 118, 219 to open in the atmosphere when it is deenergized to assume a second position B in the figure.

Figure 14:
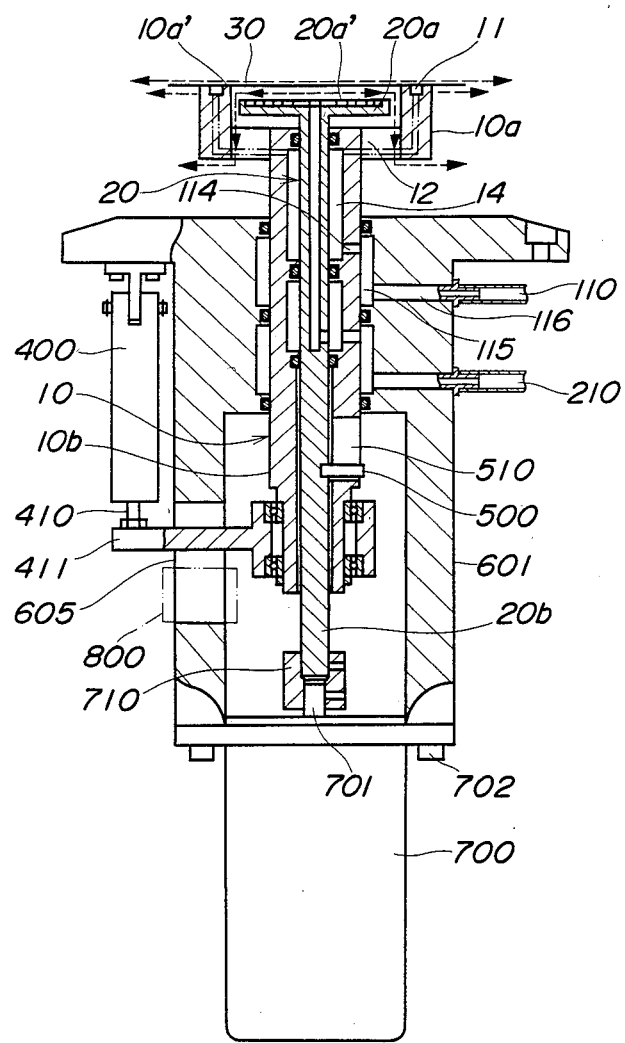
FIG. 14 is a vertical longitudinal sectional view of the apparatus of FIG. 12 with a semiconductor wafer stuck on a peripheral chuck thereof.

The operation of the wafer drying apparatus according to the invention constructed as above will now be described with reference to FIG. 12, referred to above, as well as to FIGS. 14 and 15. First, the operation will be described with assumption that the aforedescribed first embodiment of the method of the invetion is applied to the apparatus. The control unit 900 causes the solenoid valve 405 of the air cylinder 400 to be deenergized to assume the position B, whereby the piston rod 410 is retracted into the cylinder by the force of a spring, not shown, mounted in the cylinder so that the holding surface 10a' of the peripheral chuck 10a of the first vacuum nozzle 10 is lifted to a level higher than that of the holding surface 20a' of the central chuck 20a of the second vacuum nozzle 20. Then, a semiconductor wafer 30 is placed onto the holding surface 10a' of the peripheral chuck 10a of the first vacuum nozzle 10 with its center aligned with the center of rotation of the first vacuum nozzle (FIG. 14). On this occasion, by the same reason as previously stated, the backside surface of the wafer 30 should preferably be disposed in face-to-face contact with the holding surface 10a' of the peripheral chuck 10a.

When the wafer 30 has thus been placed on the peripheral chuck 10a, the solenoid valve 70 of the first vacuum nozzle 110 is energized by a control signal from the control unit 900 to assume the first position A, whereby vacuum is transmitted from the vacuum source 117 to the annular groove 11 in the holding surface 10a' through the passages 118, 116, 115, 114, 14 and 13 in the mentioned order, to thereby hold the wafer 30 stuck on the holding surface 10a' by vacuum suction.

Upon completion of the vacuum suction operation, the sensor 90 supplies a signal indicative of the completion to the control unit 900, which is in turn responsive to this signal to supply a driving signal to the motor 700 to cause same to rotate. The rotation of the motor 700 is transmitted through the coupling means 710 to the shaft portion 20b of the second vacuum nozzle 20, and then to the shaft portion 10b of the first vacuum nozzle 10 via the coupling means 500, 510. Accordingly, the peripheral chuck 10a rotates to cause rotation of the wafer 30 stuck thereon (FIG. 14).

When the rotational speed of the wafer 30 reaches a predetermined value, water droplets on the wafer 30 are scattered away from the wafer 30 due to centrifugal force in radially outward directions indicated by the arrows in FIG. 14. By the rotation of the wafer 30, not only water droplets on the upper side surface of the wafer 30 but also ones on the lower side surface thereof are scattered away from the wafer, and the latter droplets are guided downward along the inner wall of the peripheral chuck 10a and scattered radially outward through the drain ports 12 in the lower end of the peripheral chuck 10a.

When a predetermined period of time has elapsed after the rotational speed of the wafer 30 reached the above predetermined value, water droplets on surface portions of the wafer 30 other than the surface portion in contact with the peripheral chuck 10a have completely been removed from the wafer by dissipation. When the rotation of the motor 700 has continued over the above predetermined period of time after the above predetermined rotational speed was reached, the control unit 900 stops supplying the driving signal to the motor 700 to thereby stop its rotation. At the same time, the control unit 900 causes the solenoid valve 405 of the air cylinder 400 to be deenergized to change to the position A, whereby the rod 410 becomes expanded or descends to lower the holding surface 10a' of the peripheral chuck 10a to the same level as the holding surface 20a' of the central chuck 20a to make it possible for the wafer 30 to be transferred from the peripheral chuck 10a to the central chuck 20a.

As noted above, if the first embodiment of the method of the invention is applied to the present apparatus, the motor 700 is caused to completely stop rotating just before the transfer of the wafer between the first and second vacuum nozzles is effected.

Basically, in transferring the wafer 30 to the central chuck 20a after completion of the above drying step, the rod 410 of the air cylinder 400 is lowered with the solenoid valve 70 of the first vacuum supply means 110 held in the first position A, that is, with the wafer 30 stuck on the holding surface 10a' even after stopping of the rotation of the motor 700. Alternatively, the solenoid valve 70 may be switched to the second position B immediately after stopping of the rotation of the motor 700, followed by lowering the rod 410 of the air cylinder 400. According to this alternative manner, the wafer 30 rests on the peripheral chuck 10a merely due to its own weight. Therefore, it is then unnecessary to stop lowering of the rod 410 of the air cylinder just when the holding surface 10a' of the peripheral chuck 10a is brought into exactly the same level with the holding surface 20a' of the central chuck 20a.

However, to ensure stable transfer of the semiconductor wafer 30 from the peripheral chuck 10a to the central chuck 20a, the control unit 900 should preferably be programmed to operate the component elements of the drying apparatus as follows: After the complete stopping of rotation of the motor 700, the rod 410 of the air cylinder 400 should be lowered while the solenoid valve 70 of the first vacuum supply means 110 held in the first position A, that is, with the wafer 30 kept stuck on the holding surface 10a'. Then, when the holding surface 10a' of the peripheral surface 10a is brought into the same level as the holding surface 20a' of the central chuck 20a, the lowering action of the rod 410 is once interrupted, followed by energization of the solenoid valve 80 of the second vacuum supply means 210 to change same to the first position A to cause the wafer to be stuck to the holding surface 20a' of the central chuck 20a. When the sensor 100 indicates that the wafer 30 has been completely stuck on the central chuck 20a, the solenoid valve 70 of the first vacuum supply means 110 is deenergized to assume the second position B to render the wafer 30 detachable from the holding surface 10a'.

Figure 15:
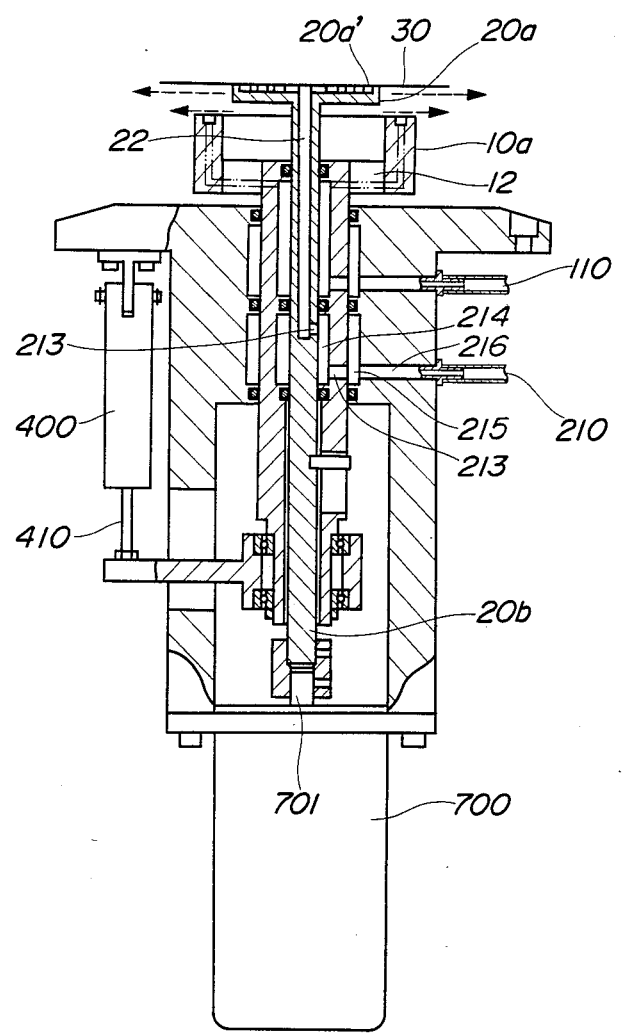
FIG. 15 is a vertical longitudinal sectional view of the apparatus of FIG. 12 with the semiconductor wafer stuck on a central chuck thereof.

After completion of the transfer of the wafer 30 from the peripheral chuck 10a to the central chuck 20a, the control unit 900 operates such that the rod 410 resumes lowering to a predetermined lowest position (FIG. 15). By employing the above-mentioned manner of drying a semiconductor wafer, it can be avoided that the center of the wafer 30 becomes out of alignment with the center of rotation of the drying apparatus, and scratches are formed on the backside surface of the wafer due to sliding contact of the same surface with the chuck.

To effect the above operation of sticking the wafer 30 to the central chuck 20a, the control unit 900 causes the solenoid valve 80 of the second vacuum supply means 210 to be energized into the first position A as stated above, whereby vacuum is transmitted from the vacuum source 218 to the grooves 21 in the central chuck 20a through the passages 219, 216, 215, 217, 213, 214, and 22 to cause the wafer 30 to be stuck to the holding surface 20a' by vacuum suction.

When an output signal from the sensor 100 which is indicative of completion of the sticking of the wafer to the holding surface, and the rod 410 of the air cylinder 400 reaches the predetermined lowest position, the control unit 900 actuates the motor 900 to start rotating. The rotation of the motor 700 is transmitted through the output shaft 701, the coupling means 710, and the shaft portion 20b of the second vacuum nozzle 20 to the central chuck 20a, to start rotating the wafer 30 stuck on the central chuck 20a.

When the rotational speed of the semiconductor wafer 30 reaches a predetermined value, residual water droplets on the portion of the backside surface of the wafer 30 stuck on the peripheral chuck 20a are scattered in the radially outward directions as indicated by the arrows in FIG. 15, due to centrifugal force caused by the rotation of the wafer 30. After the lapse of a predetermined period of time after the above predetermined rotational speed has been reached, moisture is completely removed from the surfaces of the wafer 30.

What is important is that according to the invention, as stated above, the wafer 30 is held stuck on the peripheral chuck 10a and the central chuck 20a at different surfaces portions which do not overlap with each other.

As will be aware from the above explanation, it is essentially requisite according to the first embodiment of the method of the invention that: the rotation of the motor 700 should be temporarily stopped at the transfer of the wafer 30 from the peripheral chuck 10a to the central chuck 20a; then the lowering motion of the holding surface 10a' of the peripheral chuck 10a should be temporarily stopped when the same holding surface becomes flush with the holding surface 20a' of the central chuck 20a, while still maintaining the adherence of the wafer 30 to the peripheral chuck through continued actuation of the first vacuum supply means 110; and the wafer 30 is then released from the adherence to the peripheral chuck 10a, followed by lowering the holding surface 10a' of the peripheral chuck 10a to the predetermined position lower than the holding surface 20a' of the central chuck 20a. Unless the above requisite steps are exactly carried out, the wafer 30 will be flied away from the peripheral chuck 10a, and/or scratches will be formed on the sticking backside surface of the wafer by sliding contact with the chuck.

Next, if the aforedescribed second embodiment of the method of the invention is applied to the wafer drying apparatus according to the invention, the operation of the apparatus is as follows: Even after sticking of the wafer 30 to the peripheral chuck 10a and drying of the wafer through rotation thereof have been carried out in the same manner as described above with respect to the first embodiment, the control unit 900 causes the peripheral chuck 10a to continue rotating without interruption, and at the same time actuates the air cylinder 400 to lower its rod 410 until the holding surface 10a' of the peripheral chuck 10a is brought into the same level with the holding surface 20a' of the central chuck 20a. Then, the solenoid valve 80 of the second vacuum supply means 210 is energized into the first position A to cause the wafer 30 to be stuck to the central chuck 20a which is rotating at the same speed as the peripheral chuck 10a. When the completion of sticking of the wafer to the central chuck 20a is sensed by the sensor 100, the control unit 900 causes switching of the solenoid valve 80 into the second position B to render the wafer 30 detachable from the peripheral chuck 10a and at the same time causes further lowering of the rod 410 of the air cylinder 400 to the predetermined lowest position. Thereafter, the drying operation is executed in substantially the same manner as previously described with respect to the second embodiment of the method of the invention already described with reference to FIGS. 11 (a)–(f).

In the wafer drying apparatus according to the invention, to stop lowering the peripheral chuck 10a just when its holding surface 10a' is brought into exactly the same level with the holding surface 20a' of the central chuck 20a, a stopper 800 may be fitted in the opening 605 in the housing 600 as indicated by the two dot-chain line in FIG. 14 to impede downward movement of the rod 410 of the air cylinder 400. The stopper 800 may be so disposed that when the holding surface 10a' of the peripheral chuck 10a comes into the same level with the holding surface 20a' of the central chuck 20a, the rod 410 of the air cylinder 400 collides with the stopper 800 to stop downward movement of same. Then, after completion of the transfer of the wafer 30 between the first and second vacuum nozzles, the stopper 800 is removed from the opening 605 by suitable displacing means to allow further elongation of the rod 410.

Alternatively of the air cylinder 400 as the vertically displacing means for the first vacuum nozzle 10, a feed gear mechanism using a stepping motor for instance, may be employed. If such alternative means is employed, to determine the feed distance of the feed gear mechanism it is advantageous to set beforehand a predetermined number of steps for the stepping motor to be displaced e.g. from a step position of the stepping motor corresponding to the operating position of the peripheral chuck to a step position corresponding to the level of the holding surface 10a' identical with the level of the holding surface 20a', so that when the control unit 900 counts up the set predetermined set number of steps, it causes the stepping motor to interrupt its action of lowering the peripheral chuck 10a, to thereby stop vertical displacement of the peripheral chuck 10 just when the holding surface 10a' descends to the same level with the holding surface 20a' of the central chuck 20a. Thus, the use of the above-mentioned stopper S and its displacing means can be dispensed with.

Further, if the second embodiment of the method of the invention is applied, when the lowering motion of the peripheral chuck 10a is interrupted with the holding surface 10a' on the same level with the holding surface 20a' of the central chuck 20a, first the second vacuum supply means 210 should be actuated to complete sticking of the wafer 30 to the central chuck 20a, before the vacuum-supplying action of the first vacuum supply means 110 is stopped. Otherwise, the wafer 30 will be flied away from the chucks 10a, 20a. Moreover, if the solenoid valve 80 of the second vacuum supply means 210 is energized into the first position A before the holding surface 10a' of the peripheral chuck 10a becomes exactly flush with the holding surface 20a' of the central chuck 20a, the wafer 30 will be deformed by the suction force of the vacuum supplied to the holding surface 20a' to become broken.

Whichever of the first and second embodiments of the method of the invention is applied, the wafer 30 may be first held stuck on the central chuck 20a and dried by the rotation of the chuck 20a, and thereafter the wafer 30 is transferred to the peripheral chuck 10a and further dried by the rotation of the chuck 10a, in the reverse manner to that described above, providing the same results as those obtained by using the first-mentioned sequence, by virtue of the provision of the drain ports 12 formed in the peripheral chuck 10a through which can escape water droplets scattered from the surface portion of the wafer 30 previously stuck to the central chuck 20a, during the drying rotation of the wafer 30 on the peripheral chuck 10a.

What is claimed is:

1. A method for drying a semiconductor wafer, comprising the steps of
   (a) holding said wafer on a first rotating element in a manner such that a first portion of one surface of said wafer is stuck on said first rotating element;
   (b) rotating said first rotating element together with said wafer held thereon to produce centrifugal force sufficient to cause dissipation of moisture on portions of the surfaces of said wafer other than said first portion thereof to thereby remove said moisture from said portions of the surfaces of said wafer other than said first portion thereof:
   (c) holding said wager on a second rotating element in a manner such that a second portion of said one surface of said wafer other than said first portion thereof is stuck on said second rotating element;
   (d) releasing said first rotating element from said one surface of said wafer; and
   (e) rotating said second rotating element together with said wafer held thereon to produce centrifugal force sufficient to cause dissipation of residual moisture on the surfaces of said wafer including at least said first portion thereof to thereby remove said residual moisture from said wafer.

2. A method as claimed in claim 1, wherein one of said first and second portions of said one surface of said wafer is located at a diametrically central portion of said wafer, and the other is located at a portion of said wafer radially outward of said diametrically central portion.

3. A method as claimed in claim 1, wherein said wafer has a front side surface formed with semiconductor elements, and a second side surface.

4. A method as claimed in claim 2, wherein said one the surface of said wafer is a back side surface thereof.

5. A method for drying a semiconductor wafer, comprising the steps of:
   (a) holding said wafer on a first rotating element in a manner such that a first portion of one surface of said wafer is stuck on said first rotating element;
   (b) rotating said first rotating element together with said wafer held thereon to produce centrifugal force sufficient to cause dissipation of moisture on portions of the surfaces of said wafer other than said first portion thereof to thereby remove said moisture from said portions of the surfaces of said wafer other than said first portion thereof;
   (c) causing said first rotating element to interrupt rotating after execution of said step (b);
   (d) releasing said first rotating element thus having interrupted rotating, from said one surface of said wafer;
   (e) holding said wafer on a second rotating element in a manner such that a second portion of said one surface of said wafer other than said first portion thereof is stuck on said second rotating element; and
   (f) rotating said second rotating element together with said wafer held thereon to produce centrifugal force sufficient to cause dissipation of residual moisture on the surfaces of said wafer including at least said first portion thereof to thereby remove said residual moisture from said wafer.

6. A method as claimed in claim 5, wherein said step (d) is executed after said step (e) is executed.

7. A method as claimed in claim 5, wherein said step (d) is executed before said step (f) is executed.

8. A method for drying a semiconductor wafer, comprising the steps of:
   (a) holding said wafer on a first rotating element in a manner such that a first portion of one surface of said wafer is stuck on said first rotating element;
   (b) rotating said first rotating element together with said wafer held thereon to produce centrifugal force sufficient to cause dissipation of moisture on portions of the surfaces of said wafer other than said first portion thereof to thereby remove said moisture from said portions of the surfaces of said wafer other than said first portion thereof;
   (c) rotating a second rotating element at a speed equal to that of said first rotating element while said step (b) is being executed;
   (d) holding said wafer on said second rotating element thus rotating in a manner such that a second portion of said one surface of said wafer other than said first portion thereof is stuck on said second rotating element;
   (e) releasing said first rotating element from said one surface of said wafer; and
   (f) continuing the rotation of said second rotating element together with said wafer held thereon to produce centrifugal force sufficient to cause dissipation of residual moisture on the surfaces of said wafer including at least said first portion thereof to thereby remove said residual moisture from said wafer.

9. An apparatus for drying a semiconductor wafer, which comprises:
   a first rotating element rotatable about an axis thereof;
   first holding means for holding said wafer on said first rotating element for rotation therewith in a manner such that a first portion of one side surface of said wafer is stuck by vacuum suction on said first rotating element;
   a second rotating element rotatable about an axis thereof;
   second holding means for holding said wafer on said second rotating element for rotation therewith in a manner such that a second portion of said one side surface of said wafer other than said first portion thereof is stuck by vacuum suction on said second rotation element;
   transfer means for transferring said wafer from one of said first and second rotating elements to the other; and driving means for causing rotation of said first and second rotating elements, said driving means being adapted to cause each of said first and second rotating elements to rotate at such a high speed as to produce centrifugal force sufficient to cause dissipation of moisture on the surfaces of said wafer held on said each one of said first and second rotating elements.

10. An apparatus as claimed in claim 9, wherein said first and second rotating elements are disposed concentrically with each other, said second holding means being adapted to hold a diametrically central portion of said wafer forming said second portion thereof stuck on said second rotating element, and said first holding means being adapted to hold a portion of said wafer radially outward of said diametrically central portion of said wafer forming said second portion thereof stuck on said first rotating element.

11. An apparatus as claimed in claim 10, wherein said first holding means has an annular holding surface formed on said first rotating element, and said second holding means has a circular holding surface formed on said second rotating element.

12. An apparatus as claimed in claim 11, wherein said first rotating element comprises a hollow cylindrical body having a peripheral wall portion and a bottom wall portion, said peripheral wall portion having an end face remote from said bottom wall portion and forming said annular holding surface, and a hollow shaft portion axially extending from said bottom wall portion in a direction away from said end face of said peripheral wall portion, said second rotating element comprising a disk portion disposed to be located within said hollow cylindrical body of said first rotating element, and a shaft portion axially extending from said disk portion and in said bottom wall portion and said hollow shaft portion of said first rotating element, said disk portion having an end face facing in a direction the same as said end face of said peripheral wall portion of said first rotating element and forming said circular holding surface, said bottom wall portion of said first rotating element having at least one drain port formed therein for draining moisture dissipated by the rotation of said first and second rotating elements.

13. An apparatus as claimed in claim 12, wherein said first holding means comprises an annular groove formed in said annular holding surface of said first rotating element, a vacuum passageway extending through said peripheral wall portion, bottom wall portion and hollow shaft portion of said first rotating element and opening at one end thereof in said annular groove, and means for supplying vacuum to said annular groove through said vacuum passageway.

14. An apparatus as claimed in claim 12, wherein said second holding means comprises a plurality of annular grooves concentrically formed in said circular holding surface of said second rotating element and communicating with each other, a vacuum passageway formed in said shaft portion of said second rotating element and opening at one end thereof in a central portion of said circular holding surface, and means for supplying vacuum to said annular grooves through said vacuum passageway.

15. An apparatus as claimed in claim 10, wherein said transfer means comprises displacing means for causing axial displacement of one of said first and second rotating elements relative to the other, said displacing means being adapted to displace said one of said first and second rotating elements selectively to a position allowing transfer of said wafer between said first and second rotating elements and to a position allowing rotation of one of said first and second rotating elements to which said wafer has been transferred, independently of the other, first selector means for causing said first holding means to selectively effect holding said wafer on said first rotating element and releasing said wafer from said first rotating element, second selector means for causing said second holding means to selectively effect holding said wafer on said second rotating element and releasing said wafer from said second rotating element, sensor means for detecting completion of said holding of said wafer to said first and second rotating elements by said first and second holding means and releasing of said wafer from said first and second rotating elements, and control means responsive to results of detection by said sensor means for controlling said driving means, said displacing means and said first and second selector means in a predetermined manner.

16. An apparatus for drying a semiconductor wafer, which comprises:
a first rotating element rotatable about an axis thereof
first holding means for holding said wafer on said first rotating element for rotation therewith in a manner such that a first portion of one surface of said wafer is stuck on said first rotating element;
a second rotating element rotatable about an axis thereof, said second rotating element being disposed concentrically with said first rotating element;
second holding means for holding said wafer on said second rotating element for rotation therewith in a manner such that a second portion of said one surface of said wafer other than said first portion thereof is stuck on said second rotating element.
said second holding means being adapted to hold a diametrically central portion of said wafer forming said second portion thereof stuck on said second rotating element, and said first holding means being adapted to hold a portion of said wafer radially outward of said diametrically central portion of said wafer forming said second portion thereof stuck on said first rotating element;
transfer means for transferring said wafer from one of said first and second rotating elements to the other; and
driving means for causing rotation of said first and second rotating elements, said driving means being adapted to cause each one of said first and second rotating elements to rotate at such a high speed as to produce centrifugal force sufficient to cause dissipation of moisture on the surfaces of said wafer held on said each one of said first and second rotating elements.

17. An apparatus as claimed in claim 16, wherein said first holding means has an annular holding surface formed on said first rotating element, and said second holding means has a circular holding surface formed on said second rotating element.

18. An apparatus as claimed in claim 17, wherein said first rotating element comprises a hollow cylindrical body having a peripheral wall portion and a bottom wall portion, said peripheral wall portion having an end face remote from said bottom wall portion and forming said annular holding surface, and a hollow shaft portion axially extending from said bottom wall portion in a direction away from said end face of said peripheral wall portion, said second rotating element comprising a disk portion disposed to be located within said hollow cylindrical body of said first rotating element, and a shaft portion axially extending from said disk portion and in said bottom wall portion and said hollow shaft portion of said first rotating element, said disk portion having an end face facing in a direction the same as said end face of said peripheral wall portion of said first rotating element and forming said circular holding surface, said bottom wall portion of said first rotating element having at least one drain port formed therein for draining moisture dissipated by the rotation of said first and second rotating elements.

19. An apparatus as claimed in claim 18, wherein said first holding means comprises an annular groove formed in said annular holding surface of said first rotating element, a vacuum passageway extending through said peripheral wall portion, bottom wall portion and hollow shaft portion of said first rotating element and opening at one end thereof in said annular groove, and means for supplying vacuum to said annular groove through said vacuum passageway.

20. An apparatus as claimed in claim 18, wherein said second holding means comprises a plurality of annular grooves concentrically formed in said circular holding surface of said second rotating element and communicating with each other, a vacuum passageway formed in said shaft portion of said second rotating element and opening at one end thereof in a central portion of said circular holding surface, and means for supplying vacuum to said annular grooves through said vacuum passageway.

21. An apparatus as claimed in claim 16, wherein said transfer means comprises displacing means for causing axial displacement of one of said first and second rotating elements relative to the other, said displacing means being adapted to displace said one of said first and second rotating elements selectively to a position allowing transfer of said wafer between said first and second rotating elements and to a position allowing rotation of one of said first and second rotating elements to which said wafer has been transferred, independently of the other, first selector means for causing said first holding means to selectively effect holding said wafer on said first rotating element and releasing said wafer from said first rotating element, second selector means for causing said second holding means to selectively effect holding said wafer on said second rotating element and releasing said wafer from said second rotating element, sensor means for detecting completion of said holding of said wafer to said first and second rotating elements by said first and second holding means and releasing of said wafer from said first and second rotating elements, and control means responsive to results of detection by said sensor means for controlling said driving means, said displacing means and said first and second selector means in a predetermined manner.

* * * * *

UNITED STATES PATENT AND TRADEMARK OFFICE
CERTIFICATE OF CORRECTION

PATENT NO. : 4,559,718

DATED : December 24, 1985

INVENTOR(S) : Hideo TADOKORO

It is certified that error appears in the above-identified patent and that said Letters Patent is hereby corrected as shown below:

Column 13, line 31 (claim 1), "wager" should read --wafer--;

Column 13, line 54 (claim 4), delete "the".

Signed and Sealed this

Fifteenth Day of July 1986

[SEAL]

Attest:

DONALD J. QUIGG

Attesting Officer

Commissioner of Patents and Trademarks